(12) United States Patent
Dai et al.

(10) Patent No.: US 10,366,887 B2
(45) Date of Patent: Jul. 30, 2019

(54) METHOD OF USING CHEMICALLY PATTERNED GUIDE LAYERS IN CHEMOEPITAXY DIRECTING OF BLOCK CO-POLYMERS

(71) Applicant: Brewer Science Inc., Rolla, MO (US)

(72) Inventors: Jinhua Dai, Rolla, MO (US); Joyce Lowes, Rosebud, MO (US)

(73) Assignee: Brewer Science, Inc., Rolla, MO (US)

(*) Notice: Subject to any disclaimer, the term of this patent is extended or adjusted under 35 U.S.C. 154(b) by 0 days.

(21) Appl. No.: 15/724,662

(22) Filed: Oct. 4, 2017

(65) Prior Publication Data

US 2018/0096838 A1    Apr. 5, 2018

Related U.S. Application Data

(60) Provisional application No. 62/404,041, filed on Oct. 4, 2016.

(51) Int. Cl.
| | |
|---|---|
| *H01L 29/06* | (2006.01) |
| *H01L 21/027* | (2006.01) |
| *C08F 120/68* | (2006.01) |
| *C08F 120/18* | (2006.01) |
| *H01L 21/02* | (2006.01) |
| *B05D 1/00* | (2006.01) |

(Continued)

(52) U.S. Cl.
CPC .......... *H01L 21/0271* (2013.01); *B05D 1/005* (2013.01); *C08F 120/18* (2013.01); *C08F 120/68* (2013.01); *C08L 53/00* (2013.01); *G03F 7/0002* (2013.01); *H01L 21/02118* (2013.01); *H01L 21/02282* (2013.01); *H01L 21/02304* (2013.01); *H01L 21/02345* (2013.01)

(58) Field of Classification Search
CPC . H01L 29/06; H01L 29/0649; H01L 29/0657; H01L 51/5218; H01L 51/5271
See application file for complete search history.

(56) References Cited

U.S. PATENT DOCUMENTS

| 8,551,566 B2 | 10/2013 | Fedynyshyn et al. |
| 9,123,541 B2 | 9/2015 | Xu et al. |
| 9,249,013 B2 | 2/2016 | Wang et al. |

(Continued)

FOREIGN PATENT DOCUMENTS

| JP | 2011-134856 | 7/2011 |
| KR | 10-2015-0094823 | 8/2015 |

OTHER PUBLICATIONS

International Search Report and Written Opinion dated Jan. 17, 2018 in corresponding PCT/US2017/055090 filed Oct. 4, 2017.

*Primary Examiner* — Phuc T Dang
(74) *Attorney, Agent, or Firm* — Hovey Williams LLP

(57) ABSTRACT

The present invention is broadly concerned with materials, processes, and structures that allow an underlayer to be imaged directly using conventional lithography, thus avoiding the photoresist processing steps required by prior art directed self-assembly (DSA) processes. The underlayers can be tailored to favor a selected block of the DSA block co-polymers (BCP), depending on the pattern, and can be formulated either to initially be neutral to the BCP and switch to non-neutral after photoexposure, or can initially be non-neutral to the BCP and switch to neutral after exposure. These materials allow fast crosslinking to achieve solvent resistance and possess good thermal stability.

21 Claims, 7 Drawing Sheets

(51) Int. Cl.
    *C08L 53/00*    (2006.01)
    *G03F 7/00*     (2006.01)

(56)           References Cited

U.S. PATENT DOCUMENTS

2011/0147985 A1*  6/2011  Cheng .................. G03F 7/0392
                                                         264/225
2011/0159209 A1   6/2011  Kawamura et al.
2012/0329273 A1  12/2012  Bruce et al.
2013/0273330 A1* 10/2013  Wang ................... B81C 1/0038
                                                         428/172
2015/0197594 A1   7/2015  Xu et al.
2015/0228475 A1   8/2015  Ban et al.
2016/0276149 A1*  9/2016  Smith ................. H01L 21/0271

* cited by examiner

METHOD OF USING CHEMICALLY PATTERNED GUIDE LAYERS IN CHEMOEPITAXY DIRECTING OF BLOCK CO-POLYMERS

RELATED APPLICATION

The present application claims the priority benefit of U.S. Provisional Patent Application Ser. No. 62/404,041, filed Oct. 4, 2016, entitled CHEMICALLY PATTERNED GUIDE LAYERS FOR USE IN CHEMOEPITAXY DIRECTING OF BLOCK CO-POLYMERS, incorporated by reference in its entirety herein.

BACKGROUND OF THE INVENTION

Field of the Invention

This invention pertains to materials and processes used in chemoepitaxy directed self-assembly processes.

Description of the Prior Art

The increasing demand of smaller micro-fabricated devices requires a continuous decrease in the feature size of device components. Conventional photolithography techniques become increasingly difficult and costly as the feature size approaches 22 nm and smaller. To keep Moore's law moving forward, non-lithography techniques will become more and more important. An alternative approach to generate nanoscale patterns is directed self-assembly (DSA) of block co-polymers (BCPs), which can feasibly provide highly-ordered, patternable morphologies such as lamellae and cylinders at a molecular level (<20 nm).

Current DSA process flows incorporate several layers. DSA of BCPs typically is performed on an organic, neutral "brush" layer. This brush layer usually consists of a random co-polymer of styrene and methyl methacrylate P(S-r-MMA) that has been cured over a long period of time. The block co-polymer DSA formulations are then coated to a thickness of around 300-500 Å on top of the brush layer and annealed. The annealing process causes the block co-polymer to arrange itself into alternating organized structures. A bottom anti-reflective coating is often used to control reflection of a pre-pattern. This pre-pattern is often formed by standard photolithography techniques, such as the patterning of a photoresist. Inorganic layers are also included in the process flow to facilitate the pattern transfer process (a hard mask such as $SiO_2$ or TiN). Each of these layers increases the level of complexity in the process and chemical matching challenges. The multiple layer process also increases the length of time and cost of the DSA flow.

Pre-patterning techniques, such as chemoepitaxy or graphoepitaxy, can be used along with DSA to de-randomize the alternating patterns formed by annealing the block co-polymer layers, making the technology useful in IC manufacturing. In graphoepitaxy, topography on the wafer surface, such as photoresist lines and trenches, is used to guide the self-assembly process. In chemoepitaxy, local variations in surface energy of the layer to which the DSA material is applied dictate how the block co-polymers will align.

Traditional chemoepitaxy schemes involve preparing a stack with a substrate and optional intermediate layers, such as anti-reflective coatings or hardmasks. An imaging layer is then created on top of the intermediate layer, if present, and is patterned by conventional photolithography. A neutral (or brush) layer is then deposited on the intermediate layer between the features. When the imaging layer is removed, the neutral layer is then left as a pattern that is opposite of the pattern created in the imaging layer. The self-assembling layer can then be applied over the neutral layer and is annealed. The self-assembling layer will align itself based on the pattern that was created in the neutral layer.

However, each layer and process in the chemoepitaxy process creates added expense, complexity, and potential for defects. There is a need for new compositions and methods that allow for the reduction in the number of steps, which would increase the yield and throughput of DSA patterning schemes.

SUMMARY OF THE INVENTION

The present invention overcomes the problems of the prior art by providing a method of forming a microelectronic structure. The method comprises providing a stack comprising a substrate having a surface and one or more optional intermediate layers on the substrate surface. A patternable layer having first and second surfaces is formed. The first surface is on the intermediate layers, if present, or on the substrate surface, if no intermediate layers are present. The second surface is remote from the first surface, and the patternable layer has an initial surface property at the second surface. The patternable layer is exposed to radiation so as to selectively alter the initial surface property to yield an altered surface property at the areas of exposure, forming a patterned layer. Without altering the patterned layer, a self-assembling composition is applied to the second surface of the patterned layer. The self-assembling composition comprises a block copolymer comprising a first block and a second block. The composition is caused to self-assemble into a self-assembled layer in response to the initial surface property, the altered surface property, or both. The self-assembled layer comprises a first self-assembled region and a second self-assembled region different from the first self-assembled region.

The present invention also provides a microelectronic structure comprising a substrate having a surface. There are one or more optional intermediate layers other than a neutral brush layer on the substrate surface. The structure also comprises a patterned layer having first and second surfaces, where the first surface is on the intermediate layers, if present, or on the substrate surface if no intermediate layers are present, and the second surface is remote from the first surface. The patterned layer has a first region having a first surface property and a second region having a second surface property that is different from the first surface property. The patterned layer also has an average thickness that varies by less than about 50% across the intermediate layers, if present, or across the substrate surface if no intermediate layers are present. A self-assembled layer is directly on top of the patterned layer. The self-assembled layer comprises a first self-assembled region at the first region and a second self-assembled region at the second region, with the second self-assembled region being different from the first self-assembled region.

DETAILED DESCRIPTION OF THE PREFERRED EMBODIMENTS

Figure 1:
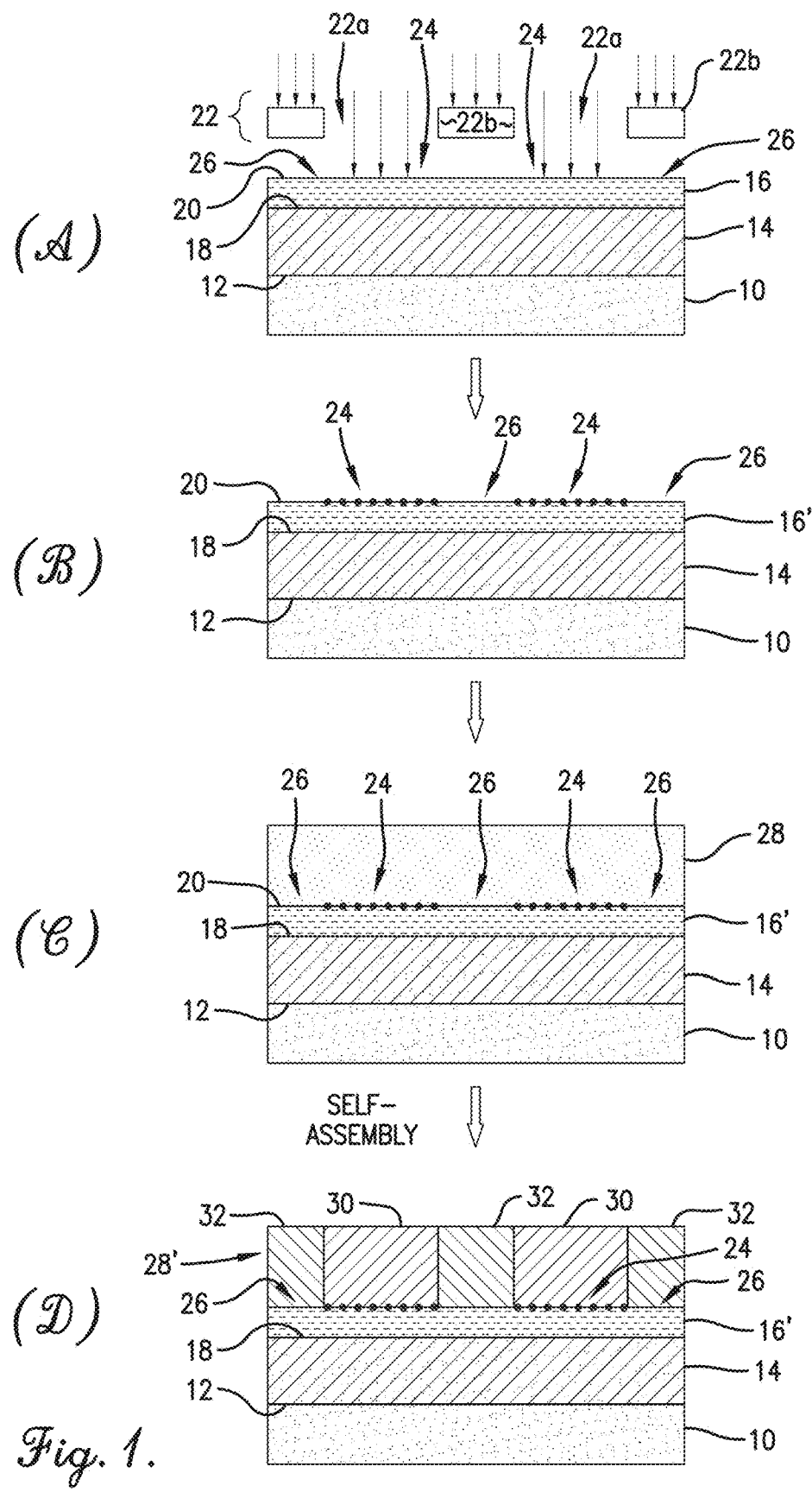
FIG. 1 is a schematic cross-sectional illustration of the inventive process.

The present invention fills a need in this technology area by broadly providing new materials for use in the DSA process, along with new methods and structures for DSA patterning. Advantageously, the invention eliminates the need for a separate imaging layer and the associated application, development, and removal steps in the process by allowing the inventive brush layer to be patterned directly. In summary, the brush layer of the present invention is photosensitive or photoimageable (i.e, patternable), and can be applied to be initially neutral or initially non-neutral.

Inventive Compositions Neutral and Non-Neutral Compositions

1. Patternable Neutral Layer

In more detail, the patternable neutral layer comprises a polymer dissolved or dispersed in a solvent system along with optional ingredients such as crosslinkers and catalysts.

The polymer should have an appropriate structure to direct the nanophase separation of the BCP. Initially, the polymer must be neutral for the target BCP (typically poly(styrene-b-methylmethacrylate), or P(S-b-MMA)). Surface energy control (SEC) components are preferably incorporated into the structure of the polymer, and those components will create a surface energy that is commensurate with that of the BCP. For example, for a standard P(S-b-MMA) BCP, a polymer comprising SEC monomers comprising: vinyl and phenyl groups; methacrylates and phenyl groups; acrylates and phenyl groups; and combinations of the foregoing are preferred.

In a preferred embodiment, the polymer comprises functional groups selected from the group consisting of photo-labile groups, electron-labile groups, acid-labile groups, and combinations of the foregoing to create the chemical nano-patterns that direct the self-assembly of the BCP. Examples of such groups include those selected from the group consisting of anthracenyl groups, o-nitrobenzyl groups, benzoin groups, phenacyl groups, oumaryl groups, benzyl groups, phenyl-containing tertbutyl esters, and combinations thereof.

In some embodiments, the polymer is a random copolymer of the SEC monomers and monomers that contain a crosslinking functionality. Crosslinking monomers contain a reactive functional group such as those selected from the group consisting of epoxies, carboxylic acids, hydroxyls, vinyl ethers, and combinations thereof. When crosslinking monomers are incorporated into the polymer structure, the polymer should comprise from about 1% to about 30% by weight crosslinking monomers, and preferably from about 5% to about 15% by weight crosslinking monomers (based upon the total polymer weight) in order to maintain appropriate surface energy and robust crosslinking.

The weight average molecular weight of the polymer is preferably from about 3,000 Daltons to about 30,000 Daltons, and more preferably from about 5,000 Daltons to about 15,000 Daltons. The polymer is preferably present in the composition at about 0.1% to about 5% by weight, and preferably about 1% by weight, based upon the total weight of the composition taken as 100% by weight.

Particular preferred polymers for this embodiment are selected from the group consisting of:

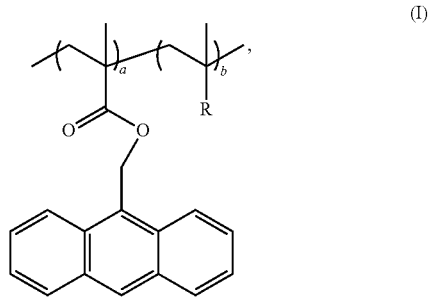

(I)

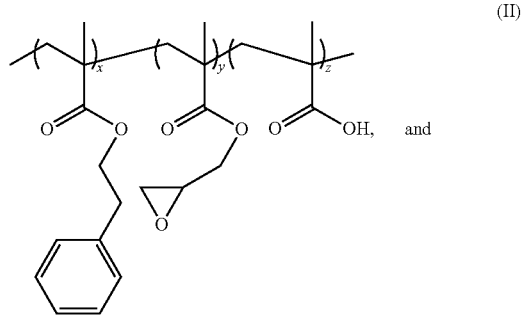

(II)

and

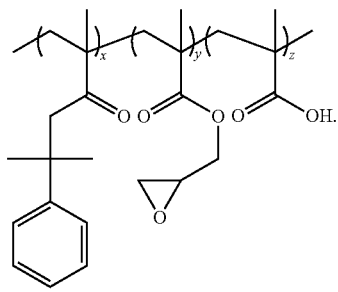
(III)

In (1), 9-anthracenylmethyl methacrylate provides surface energy control and photoactivity; R is an optional monomer (e.g., vinyls such as vinyl styrene, acrylates or methacrylates such as benzyl methacrylate, glycidyl methacrylate, methyl methacrylate, methacrylic acid) and is preferably included to adjust the surface energy in situations where the BCP utilized is not the typical P(S-b-MMA). In situations where b is not 0 (i.e., R is present) the typical ratio of a:b will be from about 50:50 to about 99:1, and preferably from about 70:30 to about 99:1.

In (II) and (III), 2-phenylethyl methacrylate and 2-phenyl-2-propyl methacrylate are photo-labile/acid-labile monomers that provide the desired surface properties, and glycidyl methacrylate and methylmethacrylic acid provide crosslinkability. The typical levels of each monomer in the polymers are:

- from about 50% to about 100% x, preferably from about 70% to about 90% x, and more preferably about 80% x;
- from about 0% to about 20% y, preferably from about 5% to about 15%% y, and more preferably about 10% y; and
- from about 0% to about 20% z, preferably from about 5% to about 15% z, and more preferably about 10% z.

In each of structures (I)-(III) the bond between the acid and aromatic-containing moiety breaks upon light exposure, thus freeing the labile, aromatic-containing moiety and leaving a carboxylic acid. This is the mechanism that changes the layer from neutral to non-neutral, as explained in more detail below.

The polymer can be formed by free radical polymerization of the monomers. To synthesize the polymer, first the monomers are dissolved in a solvent(s) that is used for photoresists or block co-polymers. Suitable solvents include those selected from the group consisting of propylene glycol monomethyl ether acetate (PGMEA), propylene glycol methyl ether (PGME), ethyl lactate, cyclohexanone, and mixtures thereof. The monomers are preferably present at a level of from about 20% to about 40% solids. An initiator is also added to the reaction mixture. Suitable initiators include those selected from the group consisting of azo compounds (e.g., 2,2'-azobisisobutyronitrile or "AIBN," 2,2'-azobis(2-methylbutyronitrile) and peroxides (e.g., dicumyl peroxide and benzoyl peroxide). The initiator should be added at about 1% to about 5% by weight, based on the weight of the monomers taken as 100% by weight.

The monomers and initiator are reacted in an inert gas atmosphere under stirring for a time of about 4 hours to about 16 hours, and the polymerization temperature is controlled in the range of from about 60° C. to about 100° C. The synthesized product can be used as the polymer mother liquor for preparing the formulations.

Examples of preferred catalysts that can be included in the neutral layer formulations are photoacid generators (PAGs) and photobase generators (PBGs). Preferred PAGs include those selected from the group consisting of sulfonium salts, iodonium salts, sulfonic acid esters, and triazine derivatives. When present, the PAG should be included in the formulation at levels of from about 0.1% to about 10% by weight, and preferably from about 1% to about 5% by weight, based upon the total weight of the solids in the composition.

Preferred PBGs include those selected from the group consisting of triphenylsulfonium hydroxide, 2-(9-oxoxanthen-2-yl)propionic acid 1,5,7-triazabicyclo[4.4.0]dec-5-ene salt, 2-nitrobenzyl cyclohexylcarbamate, 1,2-bis(3,5-dimethoxyphenyl)-2-oxoethyl cyclohexylcarbamate, N-heptyl-4-methylbenzenesulfonamide, and bicyclic guanidinium tetraphenylborate. When present, the PBG should be included in the formulation at levels of from about 0.1% to about 10% by weight, and preferably from about 1% to about 5% by weight, based upon the total weight of the solids in the composition.

Examples of suitable solvents include PGMEA, PGME, ethyl lactate, cyclohexanone, and mixtures thereof. Preferably, the solvent system is present in the composition at about 95% to about 99.9% by weight, and preferably about 99% by weight, based upon the total weight of the composition taken as 100% by weight.

2. Patternable Non-Neutral Layer

The patternable non-neutral layer comprises a polymer dissolved or dispersed in a solvent system along with optional ingredients such as crosslinkers and catalysts.

The polymer should have an appropriate structure to direct the nanophase separation of the BCP. Initially, the polymer must be non-neutral for the target block co-polymer (typically P(S-b-MMA), as noted previously). In other words, the polymer should be preferential to, or have an affinity for, one of the blocks of the target BCP. SEC components must be incorporated into the structure of the polymer that will create a surface energy that is commensurate with that of the BCP. For example, for a standard P(S-b-MMA) BCP, a polymer comprising SEC monomers comprising: vinyl and phenyl groups; methacrylates and phenyl groups; acrylates and phenyl groups; and combinations of the foregoing are preferred. Additionally, the polymer should contain photo-labile, electron-labile, acid-labile, and/or base-labile functional groups to create the chemical nanopatterns that direct the self-assembly of the BCP. Exemplary such groups include those selected from the group consisting of hydroxyls, epoxies, vinyl ethers, carboxylic acids, phenols, and silanoles.

In some embodiments, the polymer is a random co-polymer of the SEC monomers and monomers that contain a crosslinking functionality. Crosslinking monomers contain a reactive functional group such as those selected from the group consisting of epoxies, carboxylic acids, hydroxyls, and vinyl ethers. In one embodiment, the polymers include recurring monomers comprising —OH groups. Preferred such monomers comprise the moiety

When crosslinking monomers are incorporated into the polymer structure, the polymer should comprise from about 1% to about 30% by weight crosslinking monomers, and preferably from about 5% to about 10% by weight crosslinking monomers (based upon the total polymer weight) in order to maintain appropriate surface energy and robust crosslinking. The weight average molecular weight of the polymer is preferably in the range of from about 3,000 Daltons to about 30,000 Daltons, and preferably from about 5,000 Daltons to about 15,000 Daltons. The polymer should be present in the composition at about 0.1% to about 5% by weight, and preferably about 1% by weight, based upon the total weight of the composition taken as 100% by weight.

Particular preferred polymers for this embodiment are selected from the group consisting of:

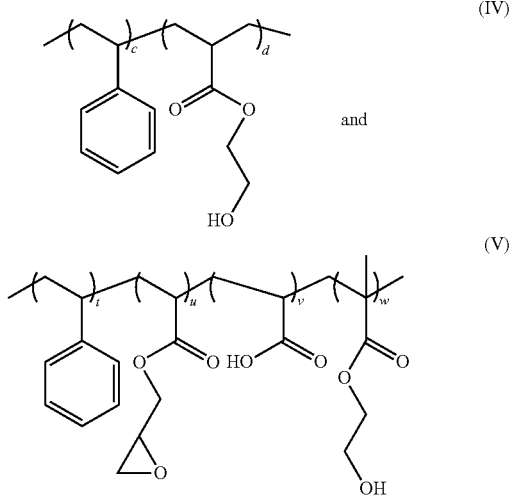

In (IV) and (V), the 2-hydroxyethyl methacrylate and styrene monomers provide the desired surface properties, and glycidyl methacrylate and methylmethacrylic acid monomers provide crosslinkability. Additionally, the In (IV), the typical ratio of c:d will be from about 99:1 to about 1:99, preferably from about 40:60 to about 60:40, and more preferably about 50:50.

In (V), the typical levels of each monomer in the polymer is:
- from about 30% to about 70% t, preferably from about 40% to about 60% t, and more preferably about 50% t;
- from about 0% to about 10% u, preferably from about 0.5% to about 5% u, and more preferably about 2.5% u;
- from about 0% to about 10% v, preferably from about 0.5% to about 5% v, and more preferably about 2.5% v; and
- from about 30% to about 70% w, preferably from about 40% to about 60% w, and more preferably about 45% w.

It will be appreciated that the acid generated upon light exposure causes a transesterification reaction in the above preferred structures of this embodiment. This causes the —OH group to crosslink (typically with a methyl methacrylic acid monomer), causing it to become neutral to the BCP, as described in more detail below.

The polymer can be formed by using the same free radical polymerization process described above with respect to the patternable neutral layer polymers.

The non-neutral layer formulations can include a catalyst, in addition to the above-described polymer. Examples of preferred catalysts are PAGs and PBGs. Preferred PAGs include those selected from the group consisting of sulfonium salts, iodonium salts, sulfonic acid esters, and triazine derivatives. When present, the PAG should be present in the formulation at a level of from about 0.05% to about 5% by weight, and preferably from about 0.1% to about 1% by weight, based upon the total weight of the solids in the composition. Preferred PBGs include those selected from the group consisting of triphenylsulfonium hydroxide, 2-(9-oxoxanthen-2-yl)propionic acid 1,5,7-triazabicyclo[4.4.0]dec-5-ene salt, 2-nitrobenzyl cyclohexylcarbamate, 1,2-bis(3,5-dimethoxyphenyl)-2-oxoethyl cyclohexylcarbamate, N-heptyl-4-methylbenzenesulfonamide, and bicyclic guanidinium tetraphenylborate. When present, the PBG should be present in the formulation at a level of from about 0.1% to about 10% by weight, preferably from about 1% to about 5% by weight, based upon the total weight of the solids in the composition.

Examples of suitable solvents include PGMEA, PGME, ethyl lactate, and cyclohexanone. Preferably, the solvent is present in the composition at about 95% to about 99.9% by weight, preferably about 99% by weight, based upon the total weight of the composition taken as 100% by weight. The surface bonded and/or crosslinked patternable non-neutral layer will be substantially insoluble in the solvents used in the self-assembling layer, as well as in common photoresist developers. This allows the self-assembling layer to be formed directly on the non-neutral layer without any intermixing. Thus, when subjected to a stripping test described with respect to the patternable neutral layer above, the patternable non-neutral layer will give similar results as those described previously. Additionally, the patternable non-neutral layer will have similar thermal stability to that described with respect to the patternable neutral layer.

Methods of Using the Inventive Compositions

Referring to FIG. 1, a substrate 10 having a surface 12 is provided. The substrate 10 can comprise a planar surface, or it can include topography (via holes, contact holes, raised features, etc.). As used herein, "topography" refers to the height or depth of a structure in or on a substrate surface. Any microelectronics substrate can be used in the invention, including those selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass phosphorous, or boron-doped glass, alpha-carbon, and mixtures of the foregoing.

An optional intermediate layer 14 can be present or formed on the surface of the substrate. Suitable intermediate layers 14 include those selected from the group consisting of hardmasks, antireflective coatings, spin-on carbon layers, amorphous carbon layers, planarization layers, and combinations of the foregoing. Multiple types of intermediate layers 14 can also be used (not shown).

In one embodiment, an intermediate layer 14 is present in the stack and comprises a carbon-rich layer. The term "carbon-rich" refers to layers formed from compositions comprising greater than about 50% by weight carbon, preferably greater than about 70% by weight carbon, and more preferably from about 75% to about 80% by weight carbon, based up on the total solids in the composition taken as 100% by weight. The carbon-rich layer can be formed by any known application method, with one preferred method being spin-coating at speeds from about 1,000 rpm to about 5,000 rpm, and preferably from about 1,250 rpm to about 1,750 rpm, for a time period of from about 30 to about 120 seconds, and preferably from about 45 to 75 seconds.

Suitable carbon-rich layers are selected from the group consisting of spin-on carbon layers (SOC), amorphous carbon layers, and carbon planarizing layers. Exemplary carbon-rich layers will generally comprise a polymer dissolved or dispersed in a solvent system, along with the following optional ingredients: acid and/or base quenchers, catalysts, crosslinking agents, and surface modification additives. The preferred compositions will be suitable for forming thick layers and will preferably have solids content of from about 0.1% to about 70%, more preferably from about 5% to about 40%, and even more preferably from about 10% to about 30% by weight, based upon the total weight of the composition taken as 100% by weight.

After the carbon-rich composition is applied, it is preferably heated to a temperature from about 100° C. to about 300° C., and more preferably from about 160° C. to about 250° C., for a time period of from about 30 seconds to about 120 seconds, and preferably from about 45 seconds to about 60 seconds, to evaporate solvents. The thickness of the carbon-rich layer after baking is preferably from about 10 nm to about 50,000 nm, more preferably from about 100 nm to about 5000 nm, and even more preferably from about 500 nm to about 1500 nm.

In another embodiment, an intermediate layer 14 that is present in the stack is a hardmask layer. The hardmask layer can be formed by any known application method, with one preferred method being spin-coating at speeds from about 1,000 to about 5,000 rpm, and preferably from about 1,250 to about 1,750 rpm, for a time period of from about 30 to about 120 seconds, and preferably from about 45 to about 75 seconds. Suitable hardmask layers are preferably high-silicon content materials selected from the group consisting of silanes, siloxanes, and silsesquioxanes. Exemplary hardmask layers will generally comprise a polymer dissolved or dispersed in a solvent system, along with the following optional ingredients: surfactants, acid or base catalysts, and crosslinkers. Typical solvent systems include those selected from the group consisting of PGME, PGMEA, gamma-butyrolactone, cyclohexanone, cyclopentanone, ethyl lactate, ethylacetoacetate, n-butyl acetate, methyl isobutyl carbinol, 2-heptanone, isopropyl alcohol, methyl ethyl ketone, and mixtures thereof. Preferred compositions will preferably have a solids content of from about 0.1% to about 70%, more preferably from about 0.5% to about 10%, and even more preferably from about 1% to about 2% by weight, based upon the total weight of the composition taken as 100% by weight.

After the hardmask is applied, it is preferably heated to a temperature from about 100° C. to about 300° C., and more preferably from about 150° C. to about 250° C. and for a time period of from about 30 seconds to about 120 seconds, preferably from about 45 seconds to about 60 seconds, to evaporate solvents. The thickness of the hardmask layer after baking is preferably from about 5 nm to about 50,000 nm, more preferably from about 5 nm to about 1000 nm, and even more preferably from about 10 nm to about 100 nm. The hardmask layer should have an etch rate at least 0.75 times that of the block co-polymer in a fluorine-rich (e.g., $CF_4$) plasma atmosphere and at least 5 times slower than the SOC in an oxygen-rich (e.g., $O_2$) plasma etch atmosphere. When applying the BCP solution, the solvent should not affect the hardmask thickness.

Some commercial hardmask layers can be used. Other preferred hardmask layers contain a co-polymer of monomers selected from the group containing (2-phenylethyl) trimethoxysilane (PETMS), 2-(carbomethoxy)ethyltrimethoxysilane (CMETMS), tetraethoxysilane (TEOS), methyltrimethoxysilane, phenyltrimethoxysilane, and combinations of the foregoing.

Regardless of the embodiment, a patternable underlayer (neutral layer or non-neutral layer) 16 having first surface 18 and second surface 20 remote from first surface 18 is then formed on the intermediate layer 14, with first surface 18 being against or on intermediate layer 14. If no intermediate layer 14 is present (not shown), the patternable underlayer 16 is formed on the surface 12 of substrate 10 so that first surface 18 is against or on surface 12 of substrate 10. The patternable underlayer 16 is formed by spin coating the composition at speeds of from about 100 rpm to about 5,000 rpm, and preferably from about 1,250 rpm to about 1,750 rpm for a time period of from about 30 seconds to about 120 seconds, and preferably from about 45 seconds to about 75 seconds.

After the patternable underlayer 16 is applied, it is preferably heated to a temperature from about 110° C. to about 250° C., and more preferably from about 180° C. to about 225° C., for a time period of from about 30 seconds to about 120 seconds, and preferably from about 45 seconds to about 75 seconds, to evaporate solvents and to crosslink the composition. The average thickness of the patternable underlayer 16 after baking is preferably from about 5 nm to about 100 nm, and more preferably from about 5 nm to about 30 nm.

In either embodiment, the crosslinked patternable underlayer 16 will be substantially insoluble in the solvents used in the self-assembling layer that will be utilized, as well as in common photoresist developers. This allows the self-assembling layer (as described below) to be formed directly on the patternable underlayer 16 without any intermixing. Thus, when subjected to a stripping test, the crosslinked patternable underlayer 16 will have a percent stripping of less than about 5%, preferably less than about 1%, and more preferably about 0%. The stripping test involves first determining the thickness by taking the average of measurements at 49 different locations of the layer. This is the average initial film thickness. Next, the film is rinsed with a solvent or developer for about 30 seconds, followed by spin-drying at about 500 to 3,000 rpm for about 20 to 60 seconds to remove the solvent. The thickness is measured again at those 49 points on the wafer using ellipsometry, and the average of these measurements is determined. This is the final film thickness. The amount of stripping is the difference between the initial and final average film thickness. The percent stripping is the amount of stripping divided by the initial film thickness multiplied by 100.

The crosslinked patternable underlayer 16 will also have good thermal stability. That is, the patternable underlayer should be able to survive temperatures of about 200° C. for about 30 minutes.

It will also be appreciated that the patternable underlayer 16 is photosensitive, meaning that it can be patterned by exposure to energy levels as low as 40 $mJ/cm^2$ and even lower. For example, the pattern can be formed at energy levels of from about 1 $mJ/cm^2$ to about 30 $mJ/cm^2$, preferably from about 1 $mJ/cm^2$ to about 25 $mJ/cm^2$, and more preferably from about 1 $mJ/cm^2$ to about 20 $mJ/cm^2$.

In addition to the above solvent-resistance and thermal stability properties, at this stage the patternable underlayer 16 comprises an initial surface property, which is preferably a property selected from the group consisting of surface energy, polarity, and combinations thereof. For the patternable non-neutral layer 16, that initial surface property will cause it to have an affinity or preference for one block of the BCP being used over the other block(s) of the BCP (i.e., the layer is non-neutral to the BCP). For the patternable neutral layer, there will be no affinity or preference towards any block in the BCP (i.e., the layer is neutral to the BCP).

The crosslinked/cured patternable underlayer 16 is then exposed imagewise to an appropriate radiation source. Suitable sources of radiation include ArF, KrF, e-beam (electron), and EUV. Suitable exposure intensities are preferably less than about 100 mJ/cm$^2$ (200 µC/cm$^2$ for e-beam irradiation), and more preferably less than about 30 mJ/cm$^2$ (50 µC/cm$^2$ for e-beam irradiation). This exposure is carried out so that it results in selective alteration of the initial surface property at the areas of exposure. In FIG. 1(A), a mask 22 is positioned above patternable underlayer 16. Mask 22 has open areas 22a designed to permit radiation to pass through the mask 22 and contact selected portions of patternable underlayer 16, thus yielding exposed areas 24 on the second surface 20 of patternable underlayer 16, where the initial surface property is modified to yield an altered surface property. The solid portions 22b of mask 22 prevent radiation from contacting patternable underlayer 16 in certain areas to yield unexposed areas 26 of patternable underlayer 16. The initial surface property of the patternable underlayer 16 is not altered at areas of non-exposure (i.e., at unexposed areas 26), however. That is, the unexposed areas 26 maintain the same properties as when the patternable underlayer 16 was first formed. This surface property difference across second surface 20 of patterned underlayer 16' is depicted in FIG. 1(B).

This exposure alters the affinity of the crosslinked underlayer 16 towards the target BCP. For the patternable non-neutral layer 16, the exposure yields an altered surface property at the exposed areas 24 that results in the disappearance of the affinity or preference for one of the blocks of the BCP over the other block(s) of the BCP (i.e., the layer has gone from non-neutral to the BCP to neutral to the BCP). For the patternable neutral layer 16, the exposure yields an altered surface property at the exposed areas 24 that results in the development of an affinity or preference in those areas towards one of the blocks in the BCP over the other block(s) in the BCP (i.e., the layer has gone from neutral to the BCP to non-neutral to the BCP).

In a preferred embodiment, this change (in either direction) in affinity can be correlated to the fact that the polarity and the surface energy of the inventive underlayer have been altered by this exposure. To be neutral, the underlayer should have a total (i.e., dispersive plus polar components) surface energy of from about 38 dyne/cm to about 44 dyne/cm, preferably from about 40 dyne/cm to about 42 dyne/cm, and preferably about 41 dyne/cm. As used herein, surface energy is measured by determining water and methylene iodide contact angles. This is accomplished using a VCA Optima (AST Products, Inc.) at a temperature of 21° C. on a sample coated by spinning at 1,500 rpm for 60 seconds. The surface energies are then calculated using SE-2500 Surface Energy (dyne/cm) software (AST Products, Inc.). As used herein, a surface area is considered to be altered if one or both of its components (i.e., dispersive or polar) has been altered, even if the total surface area value remains the same or essentially the same due to one component increasing while the other decreased.

For a patternable neutral layer 16, where the neutral layer is not exposed (i.e., at unexposed areas 26), the dispersive and polar components of surface energy of the layer should be from about 33 dyne/cm to about 41 dyne/cm and from about 3 dyne/com to about 10 dyne/cm, respectively, and preferably from about 36 dyne/cm to about 39 dyne/cm and from about 4 dyne/cm to about 8 dyne/cm, respectively. Where the patternable neutral layer 16 is exposed (i.e., at exposed areas 24), the dispersive component of the surface energy of the layer is decreased and the polar component of surface energy of the layer is increased at the areas of exposure and will typically be from about 25 dyne/cm to about 36 dyne/cm (dispersive) and from about 8 dyne/cm to about 13 dyne/cm (polar), and preferably from about 28 dyne/cm to about 35 dyne/cm (dispersive) and from about 10 dyne/cm to about 12 dyne/cm (polar). Thus, it will be appreciated that the initial or first surface energy's components have been modified by exposure to yield altered or second surface energy components at the exposure areas 24 in this embodiment.

For a patternable non-neutral layer 16 where the non-neutral layer is not exposed (i.e., at unexposed areas 26), the dispersive and polar components of surface energy of the layer should be from about 25 dyne/cm to about 36 dyne/cm and from about 8 dyne/cm to about 13 dyne/cm, respectively, and preferably from about 28 dyne/cm to about 35 dyne/cm and from about 10 dyne/cm to about 12 dyne/cm, respectively. Where the patternable non-neutral layer 16 is exposed (i.e., at exposed areas 24), the dispersive component of the surface energy of the layer is increased and the polar component of surface energy of the layer is decreased at the areas of exposure. That is, at areas of exposure, the dispersive and polar components of surface energy of the layer should be from about 33 dyne/cm to about 41 dyne/cm (dispersive) and from about 3 dyne/com to about 10 dyne/cm (polar), and preferably from 36 dyne/cm to about 39 dyne/cm (dispersive) and from about 4 dyne/cm to 8 about dyne/cm (polar). Thus, it will be appreciated that the initial or first surface energy's component have been modified by exposure to yield altered or second surface energy components at the exposed areas 24.

The surface energy ranges described above assume that a PS-b-PMMA block copolymer or similar material is used as the self-assembling composition 28. It will be appreciated that in cases where a different self-assembling composition is used, the total surface energy and dispersive and polar components of the surface energy of a neutral or non-neutral layer may be higher or lower.

A self-assembling composition 28, preferably a BCP, is then coated on top of the patterned guide layer 16'. (See FIG. 1(C)). Preferably, this coating takes place without altering the patterned guide layer 16'. That is, patterned guide layer 16' is not subjected to further processing steps (e.g., etching, dissolving, developing) or additional layer application before the composition 28 is applied thereto. In other words, the process flows directly from radiation exposure to self-assembly layer formation.

In a preferred embodiment, the composition 28 is applied to the top of patterned guide layer 16' without removing any of the patterned guide layer 16' prior to that application. In other words, the pattern formed in the patterned guide layer 16' is purely a chemical pattern (i.e., areas of difference in chemical structure) and not a physical pattern (i.e., not areas of trenches, vias, lines, or other raised or recessed features). Thus, the thickness of patterned guide layer 16' at any given location at the time self-assembling composition 28 is applied is within about 5%, preferably within about 3%, more preferably within about 1%, and even more preferably within about 0% of the thickness of patterned guide layer 16' immediately after light exposure.

Furthermore, the thickness of the patterned guide layer 16' across the substrate surface is substantially uniform. That is, the average thickness varies by less than about 50%, preferably less than about 10%, more preferably less than about 3%, and even more preferably by less than about 0% across its surface. Additionally, as noted above, the physical shape of patterned guide layer 16' preferably lacks raised or recessed features, thus making it a continuous layer as far as its overall shape or outline is concerned.

In general, the self-assembling composition 28 contains two or more immiscible compounds or a self-assembling compound comprising at least two components or blocks having distinct (and often opposite) characteristics such as functionality, polarity, water affinity, etch resistance, etc., which allows for segregation (essentially nanophase separation) and alignment of the two compounds or components in a rational manner, as well as for selective removal of one compound or component. Block co-polymers are particularly well-suited to DSA techniques, as they can be synthesized containing at least two distinct blocks allowing for each component to align under appropriate conditions, and be selectively removed after alignment.

In one embodiment, the self-assembling composition 28 comprises a block co-polymer having one block with a high etch rate, and one block with a low etch rate. P(S-b-MMA) is one example of a DSA self-assembling material useful for this invention. Other blocks commonly used in DSA block co-polymers include those selected from the group consisting of poly(lactic acid) (PLA), poly(ethylene oxide) (PEO), polydimethylsiloxane (PDMS), polyvinylpyrrolidone (PVP, 2PVP), and the like.

Modified block co-polymers can also be used in the invention. For example, individual blocks can be modified to create co-polymer blocks. In other words, the individual block itself will comprise a co-polymer within that singular block unit, and this co-polymer can be linked to another individual block to create the modified block co-polymers. For example, a polystyrene block could be modified with other monomers to allow it to crosslink, to change its etch resistance, to change its surface energy, etc.

Self-assembling compositions 28 will typically comprise the self-assembling compound dispersed or dissolved in a solvent system for casting onto the structure. Suitable solvents include those selected from the group consisting of PGME, PGMEA, gamma-butyrolactone, cyclohexanone, cyclopentanone, ethyl lactate, ethylacetoacetate, n-butyl acetate, methyl isobutyl carbinol, 2-heptanone, isopropanol, methyl ethyl ketone, and mixtures thereof.

The self-assembling composition 28 is then allowed to self-assemble into self-assembled layer 28'. (FIG. 1(D)) Self-assembly can be carried out using any suitable technique, including thermal annealing, solvent annealing, microwave annealing, and combinations thereof. In one or more embodiments, the self-assembling composition 28 (in the form of an applied layer or film) is subjected to thermal annealing by heating to sufficient temperatures, and preferably above the glass transition temperature ($T_g$) of the self-assembling compound. In one or more embodiments, the self-assembling composition 28 is heated to a temperature of from about 100° C. to about 350° C., and preferably from about 150° C. to about 250° C., for time periods of from about 30 seconds to about 10 minutes, and preferably from about 1 minute to about 5 minutes. It will be appreciated that specific annealing conditions will depend on the particular self-assembling material used, and can be varied accordingly.

During annealing and self-assembly, the different components of the self-assembling compound segregate according to their distinct characteristics, such that the self-assembled or annealed layer is essentially subdivided into at least two different self-assembled or annealed regions. In one or more embodiments, the self-assembled layer 28' comprises first self-assembled or annealed regions 30, and second self-assembled or annealed regions 32, with the first self-assembled regions 30 assembling themselves towards the areas of the underlayer (patterned guide layer) 16' for which it has affinity.

FIG. 1(D) schematically depicts the assembly that can occur, and it is generic to either embodiment (i.e., starting with a neutral underlayer 16 or starting with a non-neutral underlayer 16). If underlayer 16 started neutral, then exposed areas 24 became non-neutral upon radiation exposure and first self-assembled regions 30 were drawn to exposed areas 24 and second self-assembled regions 32 assembled accordingly. If underlayer 16 started non-neutral, exposed areas 24 became neutral upon radiation exposure and second self-assembled regions 32 were drawn to unexposed areas 26 and first self-assembled regions 30 assembled accordingly. With either embodiment, the BCP has assembled in response to the initial surface property, altered surface property, or both.

While the foregoing provides a general explanation of the assembling process, it will be appreciated that the direction of the separation of the first and second annealed regions 30, 32 is dependent upon the neutrality of the patterned underlayer (guide layer) 16'. In large areas, where the surface is neutral, the first and second self-assembled regions 30, 32 can orient horizontally, creating lines or cylinders, whereas where the surface is not neutral, the first and second self-assembled regions 30, 32 are oriented vertically, and create a dual layer structure, not a pattern.

Advantageously, in one embodiment when a patternable underlayer 16 is used, the component of the self-assembling compound with an affinity for the polar region (i.e., the exposed areas 24 for a patternable neutral layer and the unexposed areas 26 for a patternable non-neutral layer) will orient itself toward the polar region. In this way, the pattern can be controlled, rather than producing the random "fingerprint" patterns commonly seen in DSA. In order to provide sufficient guiding capacity, an ideal chemical nanopattern should have a line width that is half of the BCP periodicity ($L_0$). For example, for a BCP with a $L_0$ of 28 nm, the ideal line width of the guiding lines should be 14 nm. This line width should be achievable by using EUV or e-beam lithography.

In the case of a patternable underlayer 16 compatible with P(S-b-MMA), the MMA block would preferentially orientate itself over and across the polar (non-neutral) lines on the patterned underlayer during the anneal step, and direct the rest of BCP assembled over the neutral space. In some embodiments, it is possible to use wider line (1.5 $L_0$) to direct the BCP self-assembly at a less multiplication. A highly light-sensitive patternable underlayer is able to achieve these lines using conventional lithography.

In one embodiment, either of the first or second self-assembled regions can then be removed to generate a pattern (not shown). For example, the first self-assembled region 30 can be removed to generate a pattern in the DSA layer on the stack, followed by transferring this pattern down into any intermediate layers. It will be appreciated that instead of the first self-assembled region 30, the second self-assembled region 32 could be removed instead. The resulting pattern is eventually transferred down into the substrate 10. The pattern will typically be comprised of features such as trenches, lines, spaces, cylinders, and/or holes. Advantageously, these features will have an average (mean) respective feature size of less than about 20 nm, preferably less than about 15 nm, more preferably less than about 10 nm, and even more preferably from about 1 nm to about 10 nm. The term "feature size," as used herein, refers to the average (mean) width of the features as measured on an SEM cross-section of the stack (thus in the case of holes the width is the same as the hole diameter).

It will be appreciated that the foregoing process entirely eliminates the need for a separate imaging layer as is required with prior art DSA processes. That is, there is preferably no other imaging layer utilized in this process other than the inventive patternable layers. This greatly simplifies the process by eliminating several method steps (spinning, baking, patterning, etching) that are required when a separate imaging layer is used. Because each step has the potential to introduce defects, this simplification is significant.

Finally, in a preferred embodiment, no conventional neutral brush layer is present. That is, there are no brush layers utilized other than the inventive patternable or patterned underlayer.

Additional advantages of the various embodiments of the disclosure will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein.

In addition, while the drawings illustrate, and the specification describes, certain preferred embodiments, it is to be understood that such disclosure is by way of example only. Embodiments are described herein with reference to cross-sectional illustrations that are schematic illustrations of idealized embodiments of the present invention. As such, variations from the shapes of the illustrations as a result, for example, of manufacturing techniques and/or tolerances, are to be expected. There is no intent to limit the principles of the present embodiments to the particular disclosed embodiments. For example, in the drawings, the size and relative sizes of layers and regions may be exaggerated for clarity. In addition, embodiments should not be construed as limited to the particular shapes of regions illustrated herein but are to include deviations in shapes that result, for example, from manufacturing. For example, a region illustrated as a rectangle may have rounded or curved features. Thus, the regions illustrated in the figures are schematic in nature and their shapes are not necessarily intended to illustrate the precise shape of a region, unless specifically indicated, and are not intended to limit the scope of the embodiments disclosed herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of Poly(9-anthracenylmethyl methacrylate) and Formulation Preparation

Under yellow light, 10.0 grams of 9-anthracenylmethyl methacrylate (Heraeus), 0.50 grams of AIBN, and 40.0 grams of cyclohexanone were added to a 100-mL 2-neck round bottom flask that was equipped with a nitrogen flow and water condenser. The flask was immersed in an oil bath, and the reaction proceeded for 16 hours at 65° C. under stirring. The polymer solution mother liquor was cooled to room temperature and transferred to an amber Nalgene bottle. Formulations for patternable underlayers were prepared by diluting the mother liquor with cyclohexanone to 1.0% solids.

Example 2

Photo-Switching of Neutral Layer from Neutral to Polar with DUV Light

Figure 2:
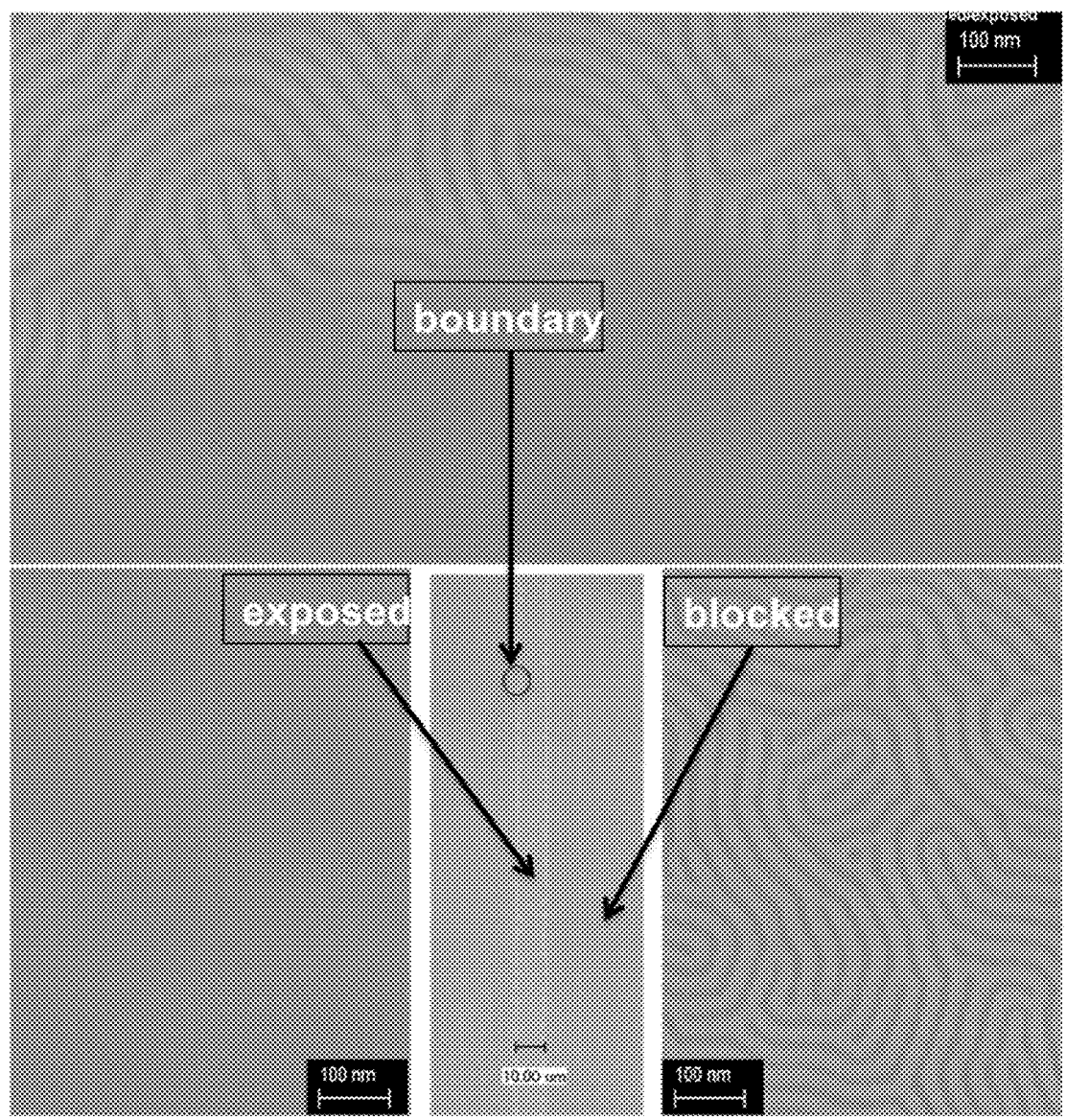
FIG. 2 is an SEM photograph showing the BCP performance on an un-exposed (blocked) area, an exposed area, and at the boundary of the exposed/un-exposed area, with an optical image provided to clarify the SEM locations (Example 2)

The sample formulated in Example 1 was coated onto a 4-inch silicon wafer by spin-coating at 1,500 rpm for 60 seconds, then baking at 205° C. for 60 seconds on a hot plate. The wafer was then exposed by placing a mask on the top of coated wafer, and exposing using DUV (Oriel Instruments Model 92531-1000) for 30 seconds. Poly(styrene-b-methyl methacrylate, $L_0$=31 nm, Arkema) was then spin coated at 1,500 rpm for 60 seconds, and the wafer was annealed at 205° C. for 5 minutes on a hot plate, follow by a short oxygen etch using an Oxford Plasmalab 80 etcher (100 W, 50 mTorr, 30 sccm, and 5 s). The finished wafer was evaluated with a scanning electron microscope (SEM) on the exposed area, on the un-exposed area, and at the juncture of exposed/un-exposed areas. FIG. 2 shows the SEM results. On the un-exposed (blocked) area, normal random BCP lamellae structure (fingerprints) are visible on the neutral underlayer, while featureless morphology appears on the exposed area. A clear transition from fingerprints to featureless morphology was obtained at the boundary between the exposed and un-exposed areas, indicating a sensitive and clean response of the underlayer to photo exposure. Systematic studies showed that less than 20 mJ/cm$^2$ can switch the material from neutral to non-neutral.

Example 3

Figure 3:
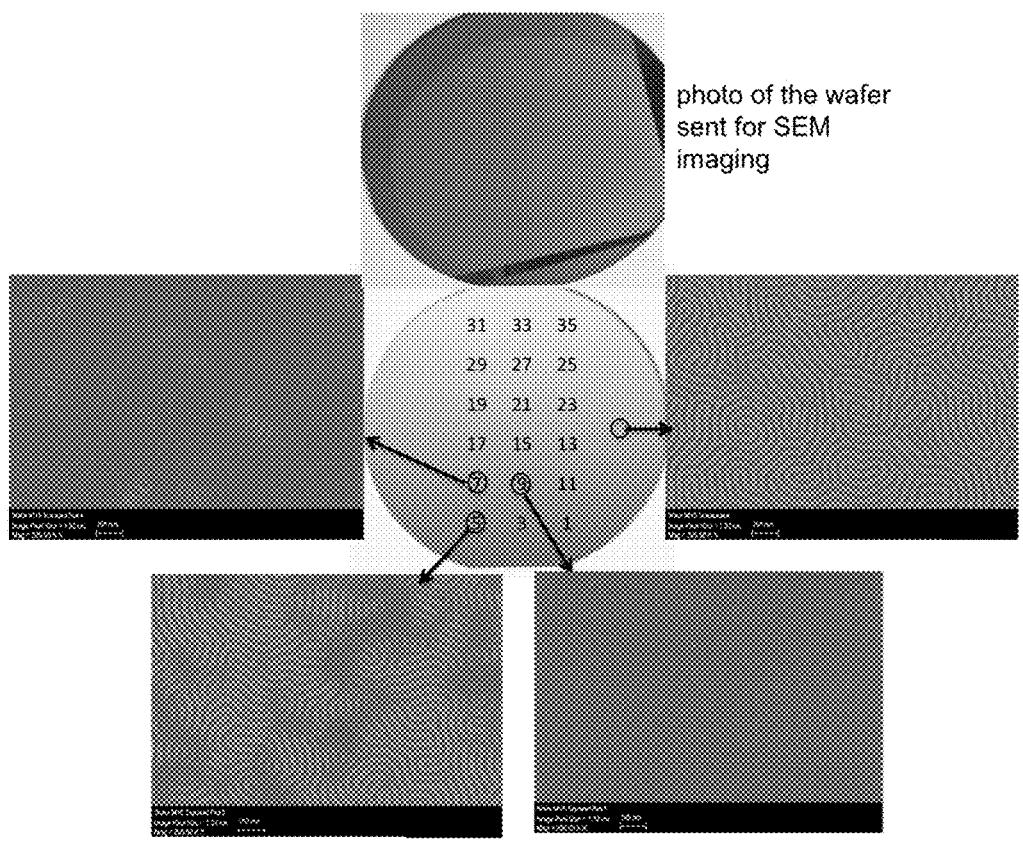
FIG. 3 is an SEM photograph showing the BCP performance on an un-exposed (middle right) area and exposed areas with varied doses as numbered (middle center), as well as the boundary of the exposed/un-exposed areas, with an optical image of the finished wafer at the top (Example 3)

Photo-Switching of Neutral Layer from Neutral to Polar with ArF (193 nm) Light The sample formulated in Example 1 was spin-coated onto a silicon wafer by spinning at 1,500 rpm for 60 seconds, and then baked at 205° C. for 60 seconds. The coated wafer was exposed with a 193-nm Amphibian XIS lithography tool in a pattern shown in FIG. 3. The 18 exposed spots were 1.0-cm diameter circles. Exposure was started with 1 mJ/cm$^2$, followed by 2 mJ/cm$^2$ steps. After lithography, the BCP was coated, annealed, and etched as described in Example 2. SEM results are shown in FIG. 3. SEM images taken on the un-exposed area show normal fingerprint structure, images taken at doses above 9 mJ/cm$^2$ show no pattern, and at ~5 mJ/cm$^2$, the pattern transition is seen. The optical photo of the exposed wafer (top) and its dose arrangement (center) are also included to assist the view. These results clearly show that the underlayer is BCP-neutral (perpendicular lamellae, fingerprint pattern) and can be efficiently changed to non-neutral (horizontal lamellae, no pattern) at an ArF wavelength with high sensitivity.

Example 4

Synthesis of Photo- and Electron-Labile Neutral Layer Materials

In this Example, 16.55 grams (80.0 mmol) of 2-phenylethyl methacrylate (Polysciences, Inc.), 1.42 grams (10.0 mmol) of glycidyl methacrylate (Sigma-Aldrich), 0.86 grams (10.0 mmol) of methacrylic acid (Sigma-Aldrich), 0.38 grams of Vazo 67 (Dow Chemical), and 40.0 grams of propylene glycol monomethyl ether acetate (PGMEA, General Chemical) were added to a 250-mL 3-neck flask. The flask was equipped with magnetic bar, nitrogen inlet/outlet, and water condenser. The polymerization proceeded at 75° C. for 16 hours. After the flask was cooled to room temperature, the polymer mother liquor was bottled for later use.

Example 5

Synthesis of 2-phenyl-2-propyl methacrylate

In this procedure, 25.0 grams (0.18 mol) of 2-phenyl-2-propanol, 20.24 grams (0.20 mol) of triethylamine, and 300.0 grams of dichloromethane were added to a 1000-mL round flask (equipped with a magnetic bar). The flask was placed in an ice water bath. After the solution temperature dropped to <5° C., 20.9 grams (0.20 mol) of ice-water-cooled methacryloyl chloride was added drop-wise into the flask while maintaining vigorous stirring. After 4 hours of reaction at ice-bath temperature, the mixture was poured into 500.0 grams of ice water and stirred for 1 hour. The organic phase was washed sequentially with 500.0 grams of cold 1.0M HCl twice and 2.0M NaHCO$_3$ twice, then dried over anhydrous MgSO$_4$ for overnight in a refrigerator. Solvent was removed via a rotary evaporator and vacuum while maintaining low temperature. The oily product was stored in a refrigerator.

Example 6

Figure 4:
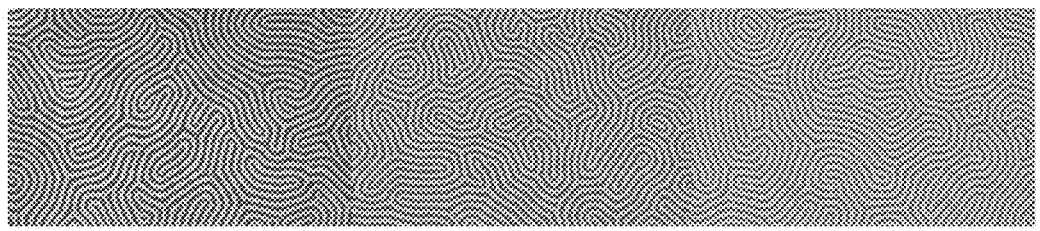
FIG. 4 is an SEM photograph (200KX) showing the radiation-imageable neutral layer characterization and neutrality demonstration of the layers tested in Example 6 (left to right, 31-nm BCP, 25-nm BCP, and 21-nm BCP)

Neutrality Demonstration of the Patternable Neutral Layers with Commercial BCP The mother liquor prepared in Example 4 was diluted to 1.0% solids in PGMEA. PAG TPS-C1 (a triphenylsulfonium salt with tris[(trifluoromethyl)sulfonyl]methane (1:1), from Heraeus) was added at a PAG/polymer ratio of 5%. Formulations were spin-coated at different spin rates to obtain neutral layers ("NLs") of various thicknesses. The coatings were baked at 205° C. for 60 seconds. Stripping tests were done with PGMEA puddling for 60 seconds, followed by baking at 100° C. for 1 minute. Water and methylene iodide contact angles were measured using a VCA Optima on the sample coated at 1,500 rpm, and surface energies were calculated using SE-2500 Surface Energy (dyne/cm) software. A commercial BCP (poly(styrene-b-methyl methacrylate), 25-b-26, Polymer Source) dissolved in PGMEA at 1.0% solids by weight was coated on top of the neutral layer and annealed at 205° C. for 5 minutes. After a short oxygen etching (100 W, 50 mTorr, 30 sccm, and 5 sec), wafers were reviewed with scanning electron microscopy. Table 1 shows the results of the stripping tests, and Table 2 shows the contact angle and surface energy measurements, where $\gamma_d$, $\gamma_p$, and $\gamma_t$ are dispersive, polar, and total surface energy, respectively. Table 3 shows the BCP processing parameters, and FIG. 4 shows the patternable neutral layer characterization and neutrality demonstration (left to right, 31-nm BCP, 25-nm BCP, and 21-nm BCP).

TABLE 1

Strip test results from Example 6

| SPIN SPEED (RPM) | INITIAL THICKNESS (Å) | THICKNESS AFTER PGMEA (Å) | THICKNESS AFTER BAKE (Å) | THICKNESS LOST (Å) | % LOST |
|---|---|---|---|---|---|
| 1000 | 356 | 346 | 341 | 15 | 4.21 |
| 1500 | 289 | 279 | 276 | 13 | 3.46 |
| 2000 | 250 | 243 | 240 | 10 | 3.95 |
| 2500 | 224 | 218 | 215 | 9 | 3.96 |

TABLE 2

Contact angle and surface energy measurements from Example 6

| MATERIAL | THICKNESS (Å) | CONTACT ANGLE (WATER) | CONTACT ANGLE (MI) | $\gamma_d$ | $\gamma_p$ | $\gamma_t$ |
|---|---|---|---|---|---|---|
| NL | 290 | 77.71 | 34.35 | 38.44 | 4.44 | 42.88 |
| NL | 289 | 78.29 | 35.04 | 38.24 | 4.27 | 42.51 |

TABLE 3

BCP Processing Parameters

| NL THICKNESS (Å) | BCP SPIN COATING SPEED (RPM) | BCP THICKNESS |
|---|---|---|
| 289 | 1,000 | 315 |
| 290 | 1,500 | 251 |
| 290 | 2,000 | 214 |

Example 7

Figure 5:
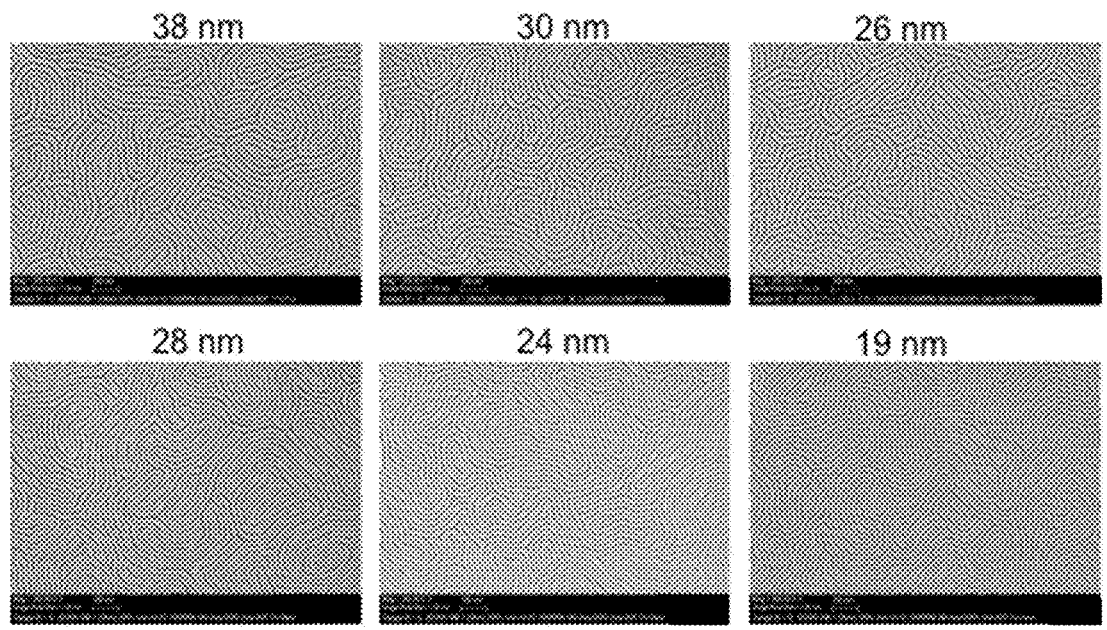
FIG. 5 is an SEM photograph showing the photo-patternable neutral layer characterization and neutrality demonstration with experimental high-χ BCP (top χ=0.09, bottom χ=0.04) of the layers tested in Example 7.

Neutrality Demonstration of the Patternable Neutral Layers with Experimental High-$\chi$ BCP The mother liquor prepared in Example 4 was diluted to 1.0% solids in PGMEA. PAG TPS-C1 (Heraeus) was added at a level of 5% by weight PAG, based on the polymer weight. Formulations were spin-coated at different spin rates to obtain neutral layers of various thicknesses. The coatings were baked at 205° C. for 60 seconds. Stripping tests were done with PGMEA puddling for 60 seconds, followed by baking at 100° C. for 1 minute. Water and methylene iodide contact angles were measured using a VCA Optima on the sample coated at 1,500 rpm, and surface energies were calculated using SE-2500 Surface Energy (dyne/cm) software. A high-$\chi$ (0.09) BCP (Brewer Science, Inc., described in Examples 1-6 of U.S. Patent Application Publication No. 2015-0197594) dissolved in PGMEA at 1.0% solids by weight was coated on top of the neutral layer and annealed at 180° C. for 3 minutes and then at 205° C. for 2 minutes. After a short oxygen etch (100 W, 50 mTorr, 30 sccm, and 5 sec), wafers were reviewed with scanning electron microscopy. Table 4 shows the BCP processing parameters, and FIG. 5 shows the patternable neutral layer characterization and neutrality demonstration with two high-$\chi$ BCPs (top $\chi$=0.09, bottom $\chi$=0.04).

TABLE 4

BCP processing parameters

| NL THICKNESS (Å) | BCP $\chi$ | BCP SPIN COATING SPEED (RPM) | BCP THICKNESS (NM) |
|---|---|---|---|
| 290 | 0.09 | 1,000 | 38 |
| 291 | 0.09 | 1,500 | 30 |
| 290 | 0.09 | 2,000 | 26 |
| 290 | 0.04 | 1,000 | 28 |
| 290 | 0.04 | 1,500 | 24 |
| 290 | 0.04 | 2,000 | 19 |

Example 8

Demonstration of Photo-Switching of Neutral Layer from Neutral to Polar

Figure 6:
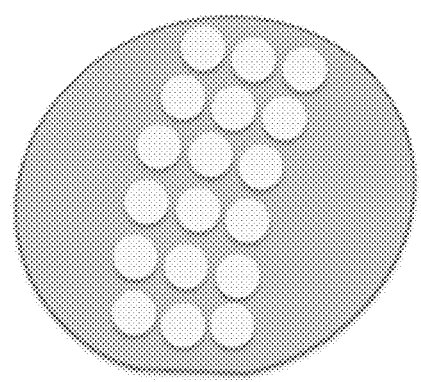
FIG. 6 is an exposure diagram showing the exposure pattern of neutral-layer-coated wafers from Example 8.
Figure 7:
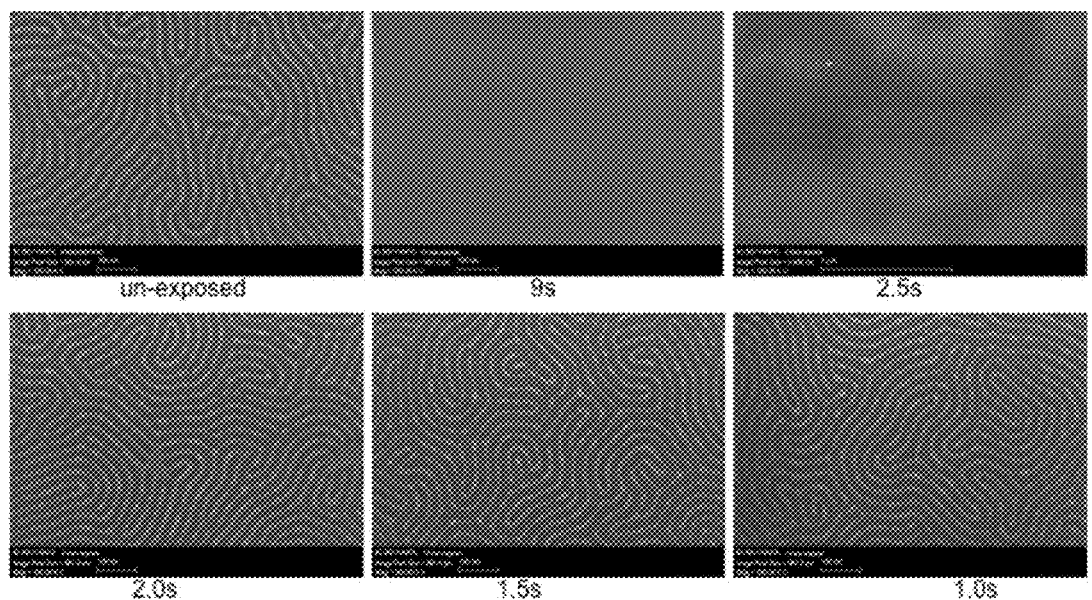
FIG. 7 is a plurality of SEM photographs taken at different locations after the lithography described in Example 8.

The mother liquor prepared in Example 4 was diluted to 1.0% solids in PGMEA. PAG TPS-C1 was added at a level of 5%, based on the polymer weight. The formulations were spin-coated at 1,500 rpm to obtain neutral layers having a thickness of 27 nm, followed by baking at 205° C. for 60 seconds. Neutral-layer-coated wafers were exposed with a 193-nm amphibian lithography tool in a pattern shown in FIG. 6. The 18 exposed spots were 1.0-cm diameter circles. Exposure was started at 0.5 second, followed by 0.5-second steps. After the lithography, the BCP was coated, annealed, and etched as described in Example 6. SEM results are shown in FIG. 7. The SEM images taken on the un-exposed area show normal fingerprint structure, images taken with high dose (>3 s) show no pattern, and at ~2.5 s, the pattern transition is seen. This result indicates that photo exposure changed the surface properties of the under layer surface, making it BCP-neutral (perpendicular lamellae, fingerprint pattern) to BCP-selective (horizontal lamellae, no pattern).

Example 9

Synthesis of Photo-Patternable Non-Neutral Layer Materials

In this Example, 32.5 grams of styrene (Sigma-Aldrich), 32.5 grams of 2-hydroxyethyl methacrylate (HEMA, Sigma-Aldrich), 1.5 grams of AIBN (Sigma-Aldrich), and 152.0 grams of propylene glycol methyl ether (PGME, General Chemical) were added to a 250-mL 3-neck flask. The flask was equipped with magnetic bar, nitrogen inlet/outlet, and water condenser. The polymerization proceeded at 65° C. for 16 hours. After the flask was cooled to room temperature, the polymer mother liquor was bottled for later use.

Example 10

Figure 8:
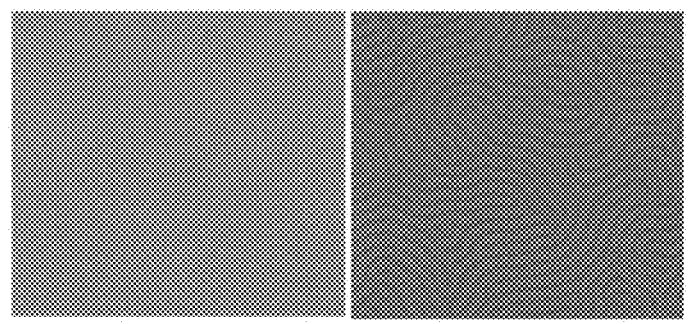
FIG. 8 shows SEM photographs (200KX) of the photo-patternable non-neutral material after BCP coat and anneal as described in Example 10, with the BCP on un-exposed non-neutral material (left) and the BCP on exposed non-neutral material (right)

Demonstration of Photo-Switching of Non-Neutral Layer from Non-Neutral to Neutral The mother liquor prepared in Example 9 was diluted to 1.0% solids in PGME. PAG TPS-C1 (Heraeus) was added at a level of 5% by weight PAG, based on the polymer weight. Formulations were spin-coated at 1,500 rpm for 60 seconds and baked at 205° C. for 60 seconds. Wafers were then exposed for 2 seconds under DUV (Oriel Instruments Model 92531-1000) and baked at different temperatures. The film as coated had a thickness of 35.8 nm. After 20 seconds of PGME stripping and soft bake at 130° C. for 60 seconds, film thicknesses and water contact angles (WCAs) were measured. These results are listed in Table 5. To observe the photo-switching of the non-neutral layer from non-neutral to neutral, 1.0% P(S-b-MMA) (P4961-SMMA, Polymer Source) in PGMEA was coated at 1,500 rpm for 60 seconds and annealed at 205° C. for 5 minutes. After a brief oxygen etch (100 W, 50 mTorr, 30 sccm, and 5 seconds), wafers were reviewed with scanning electron microscopy, and these results are shown in FIG. 8. Referring to FIG. 8, the left image shows a photo-patternable, non-neutral material that was not exposed, and no fingerprints were found. The right image shows the same material that was exposed before BCP coat and anneal, and fingerprints were formed on the entire exposed area.

TABLE 5 thickness and water contact angle of wafers with and without photo exposure.

| WAFER # | TREATMENT | THICKNESS AFTER 20-S PGME RINSE AND 130° C., 60 S BAKE | WCA |
|---|---|---|---|
| 1 | None | 6 nm | 68.6 |
| 2 | 2-s broadband exposure, PEB at 130° C. for 60 seconds | 33.2 nm | 74.6 |

TABLE 5-continued thickness and water contact angle of wafers with and without photo exposure.

| WAFER # | TREATMENT | THICKNESS AFTER 20-S PGME RINSE AND 130° C., 60 S BAKE | WCA |
|---|---|---|---|
| 3 | 2-s broadband exposure, PEB at 168° C. for 60 seconds | 33.1 nm | 76.6 |
| 4 | 2-s broadband exposure, PEB at 185° C. for 60 seconds | 32.3 nm | 76.9 |
| 5 | 2-s broadband exposure, PEB at 205° C. for 60 seconds | 32.6 nm | 77.1 |
| 6 | 2-s broadband exposure, PEB at 205° C. for 300 seconds | 32.5 nm | 77.3 |

Example 11

BCP Patterning on Photo-Patternable Underlayer, from Macroscopic to Microscopic

The mother liquor prepared in Example 9 was diluted to 0.25% solids in PGME. PAG TPS-C1 (Heraeus) or Irgacurem 290 (BASF) was added at a level of 5% by weight PAG, based on the polymer weight. Formulations were spin-coated at 1,500 rpm for 60 seconds and baked at 205° C. for 60 seconds. Patterns were defined by: a half-wafer block with an opaque rubber; a contact mask made from ProTEK® PS material (Brewer Science, Rolla, Mo.); or a 10×SEM cleave mask (Benchmark Technology).

After photo exposure, wafers were baked at 168° C. for 60 seconds, then stripped with PGMEA for 20 seconds. They were then soft-baked at 130° C. for 60 seconds. BCP (P(S-b-MMA), 25-b-26, Polymer Source) was then coated and annealed at 205° C. for 5 minutes. After a brief oxygen etch (100 W, 50 mTorr, 30 sccm, for 5 seconds), wafers were reviewed with scanning electron microscopy or atomic force microscopy (AFM). The results are shown in FIGS. 9-11.

Figure 9:
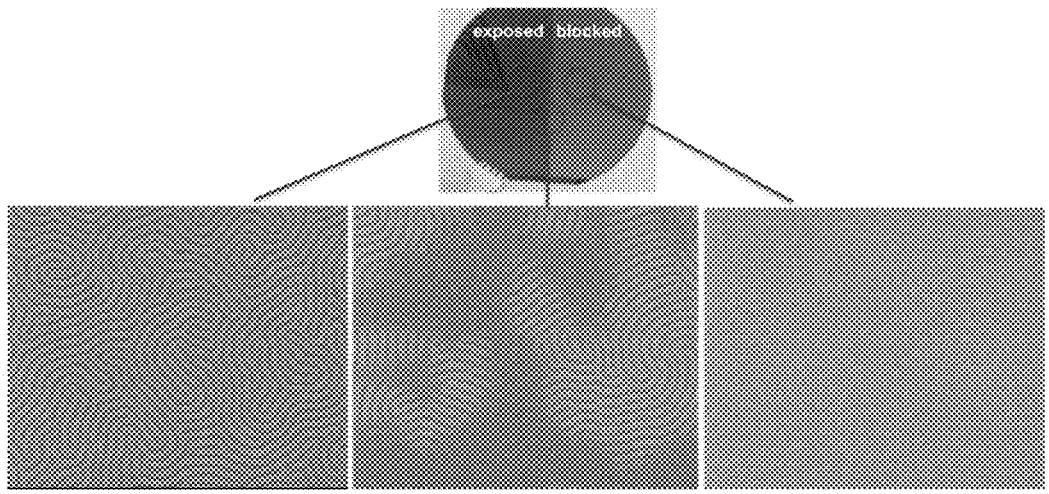
FIG. 9 shows SEM photographs (200KX) of a fingerprint pattern, boundary, and featureless areas using a rubber mask as described in Example 11.

FIG. 9 shows BCP patterning on a photo-patternable, non-neutral underlayer (which included PAG TPS-C1) that was half blocked with an opaque rubber. On the exposed half of the wafer, a normal BCP fingerprint pattern was seen, while on the un-exposed half of the wafer, no fingerprint structure was present. At the boundary of the two areas, a mix of fingerprints and featureless morphology was observed.

Figure 10:
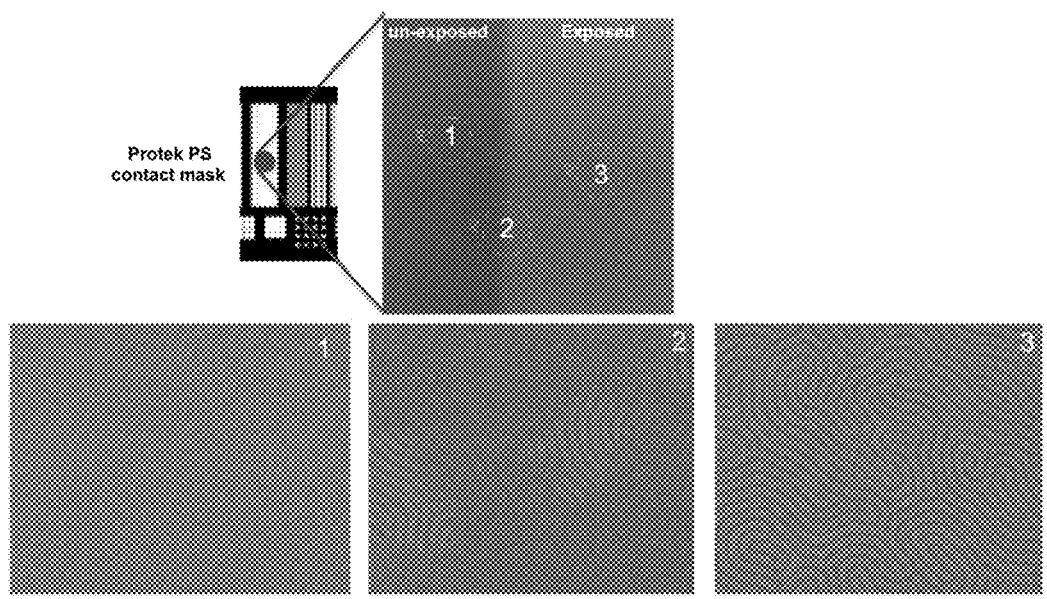
FIG. 10 shows SEM photographs (200KX) of a fingerprint pattern, boundary, and featureless areas using a Pro-TEK® PSR material mask as described in Example 11.

In FIG. 10, a contact mask of ProTEK® PS material was placed on top of a photo-patternable, non-neutral underlayer (which included PAG TPS-C1). Millimeter-scaled, exposed/un-exposed line patterns were obtained, and SEM images were taken across the exposed/un-exposed boundary. Again, fingerprints/mixed/featureless patterns are clearly shown.

Figure 11:
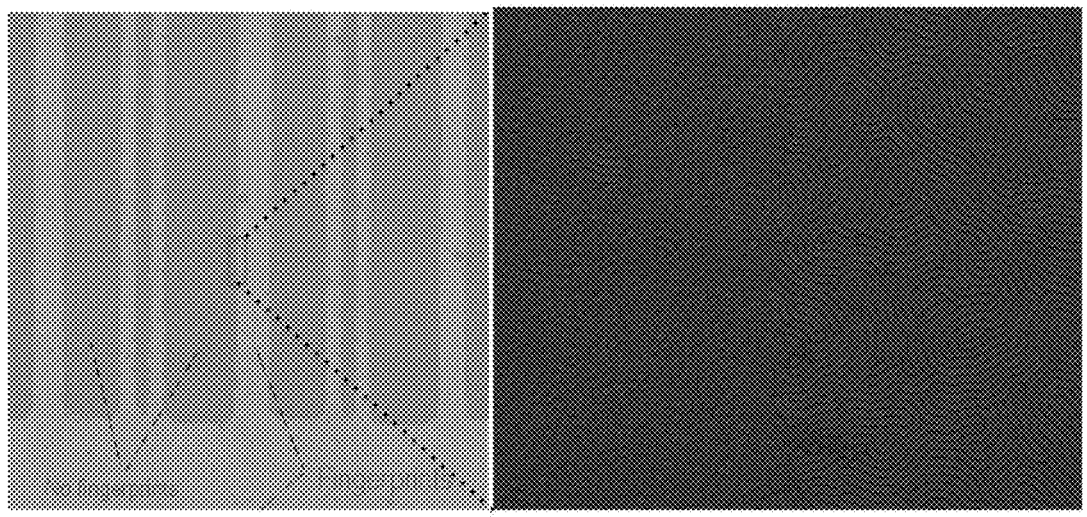
FIG. 11 shows SEM photographs of a fingerprint pattern, boundary, and featureless areas using a wafer stepper as described in Example 11.

FIG. 11 shows the use of Irgacure® and the resulting micrometer-scale lithography patterns obtained using a DSW-wafer-stepper and 10×SEM cleave mask. A clear-cut fingerprint/featureless boundary was obtained.

We claim:

1. A method of forming a microelectronic structure, said method comprising: providing a stack comprising:
    a substrate having a surface; and
    one or more optional intermediate layers on said substrate surface;
    forming a patternable layer having first and second surfaces, said first surface being on said intermediate layers, if present, or on said substrate surface, if no intermediate layers are present, and said second surface being remote from said first surface, said patternable layer having an initial surface property at said second surface;
    exposing said patternable layer to radiation so as to selectively alter said initial surface property to yield an altered surface property at the areas of exposure, forming a patterned layer;
    without altering said patterned layer, applying a self-assembling composition to the second surface of said patterned layer, said composition comprising a block copolymer comprising a first block and a second block; and
    causing said composition to self-assemble into a self-assembled layer in response to the initial surface property, the altered surface property, or both, wherein said self-assembled layer comprises a first self-assembled region and a second self-assembled region different from said first self-assembled region, wherein:
        said initial surface property is a lack of affinity towards one of said first and second blocks over the other of said first and second blocks; and
        during said exposing, an affinity to one of said first and second blocks over the other of said first and second blocks develops, said affinity being the altered surface property.

2. The method of claim 1, wherein said initial surface property comprises an initial surface energy and the altered surface property comprises an altered surface energy that is different from said initial surface energy.

3. The method of claim 2, wherein:
    the dispersive and polar components of said initial surface energy are from about 33 dyne/cm to about 41 dyne/cm and from about 3 dyne/com to about 10 dyne/cm, respectively; and
    the dispersive and polar components of said altered surface energy are from about 25 dyne/cm to about 36 dyne/cm and from about 8 dyne/cm to about 13 dyne/cm, respectively.

4. The method of claim 1, wherein said affinity is towards the first block, and during said causing the first block assembles and forms said first self-assembled region at said altered surface property.

5. The method of claim 1, wherein said patternable layer comprises a polymer dispersed or dissolved in a solvent system, said polymer comprising recurring monomers that comprise functional groups selected from the group consisting of photo-labile groups, electron-labile groups, acid-labile groups, and combinations of the foregoing.

6. The method of claim 5, wherein said recurring monomers comprise an aromatic-containing moiety bonded with an acid moiety, and the bond between said aromatic-containing moiety and said acid moiety being broken during said exposure.

7. The method of claim 5, wherein said functional group is selected from the group consisting of anthracenyl groups, o-nitrobenzyl groups, benzoin groups, phenacyl groups, oumaryl groups, benzyl groups, phenyl-containing tertbutyl esters, and combinations thereof.

8. The method of claim 5, wherein said polymer further comprises recurring crosslinkable monomers.

9. The method of claim 1, wherein said patterned layer has a thickness at any given location at the time of applying that is within about 5% of the thickness of said patterned layer at the same location immediately after light exposure.

10. The method of claim 1, wherein said patternable layer is the only photosensitive or imaging layer that is used or present during or between said providing, forming, exposing, applying, and causing.

11. The method of claim 1, wherein said first block possesses at least one property that is different from said second block, where said property is selected from the group consisting of functionality, polarity, water affinity, and etch resistance.

12. The method of claim 1, further comprising removing one of said first self-assembled region or second self-assembled region to yield a pattern in said self-assembled layer.

13. The method of claim 12, further comprising transferring said pattern into said intermediate layer, if present, and into said substrate, wherein said pattern comprises a plurality of features selected from the group consisting of trenches, spaces, via holes, contact holes having an average feature size of less than about 20 nm.

14. The method of claim 1, wherein said first and second blocks are individually selected from the group consisting of polystyrene, poly(methyl methacrylate), poly(lactic acid), poly(ethylene oxide), polydimethylsiloxane, and polyvinylpyrrolidone.

15. The method of claim 1, wherein said causing comprises heating said self-assembling composition to at least about the glass transition temperature of said block copolymer, wherein said self-assembling composition self-assembles during said heating.

16. The method of claim 1, wherein said substrate is a semiconductor substrate selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing.

17. A method of forming a microelectronic structure, said method comprising:
  providing a stack comprising:
    a substrate having a surface; and
    one or more optional intermediate layers on said substrate surface;
  forming a patternable layer having first and second surfaces, said first surface being on said intermediate layers, if present, or on said substrate surface, if no intermediate layers are present, and said second surface being remote from said first surface, said patternable layer having an initial surface property at said second surface and comprising a polymer dispersed or dissolved in a solvent system, said polymer comprising recurring monomers comprising —OH groups;
  exposing said patternable layer to radiation so as to selectively alter said initial surface property to yield an altered surface property at the areas of exposure, forming a patterned layer;
  without altering said patterned layer, applying a self-assembling composition to the second surface of said patterned layer, said composition comprising a block copolymer comprising a first block and a second block; and
  causing said composition to self-assemble into a self-assembled layer in response to the initial surface property, the altered surface property, or both, wherein said self-assembled layer comprises a first self-assembled region and a second self-assembled region different from said first self-assembled region, wherein:
    said initial surface property is an affinity towards one of said first and second blocks over the other of said first and second blocks; and
    during said exposing, said affinity disappears so that said altered surface property is neutral towards said first and second blocks.

18. The method of claim 17, wherein:
the dispersive and polar of said initial surface energy are from about 25 dyne/cm to about 36 dyne/cm, and from about 8 dyne/cm to about 13 dyne/cm, respectively; and
the dispersive and polar of said altered surface energy is from about 33 dyne/cm to about 41 dyne/cm, and from about 3 dyne/com to about 10 dyne/cm, respectively.

19. The method of claim 17, wherein said polymer comprises recurring monomers comprising the moiety

20. The method of claim 17, wherein said —OH groups crosslink during said exposure.

21. A method of forming a microelectronic structure, said method comprising:
  providing a stack comprising:
    a substrate having a surface; and
    one or more optional intermediate layers on said substrate surface;
  forming a patternable layer having first and second surfaces, said first surface being on said intermediate layers, if present, or on said substrate surface, if no intermediate layers are present, and said second surface being remote from said first surface, said patternable layer having an initial surface property at said second surface;
  exposing said patternable layer to radiation so as to selectively alter said initial surface property to yield an altered surface property at the areas of exposure, forming a patterned layer;
  without altering said patterned layer, applying a self-assembling composition to the second surface of said patterned layer, said composition comprising a block copolymer comprising a first block and a second block;
  causing said composition to self-assemble into a self-assembled layer in response to the initial surface property, the altered surface property, or both, wherein said self-assembled layer comprises a first self-assembled region and a second self-assembled region different from said first self-assembled region;
  removing one of said first self-assembled region or second self-assembled region to yield a pattern in said self-assembled layer; and
  transferring said pattern into said intermediate layer, if present, and into said substrate, wherein said pattern comprises a plurality of features selected from the group consisting of trenches, spaces, via holes, and contact holes having an average feature size of less than about 20 nm.

* * * * *